Feb. 25, 1969 G. J. OVERTVELD 3,430,076

TEMPERATURE COMPENSATED BIAS CIRCUIT

Filed May 27, 1966

INVENTOR
G. J. OVERTVELD
Curphey & Erickson
PATENT AGENTS

United States Patent Office 3,430,076

Patented Feb. 25, 1969

3,430,076

TEMPERATURE COMPENSATED BIAS CIRCUIT

Gilles J. Overtveld, Ottawa, Ontario, Canada, assignor to Northern Electric Company Limited, Montreal, Quebec, Canada Filed May 27, 1966, Ser. No. 553,498

U.S. Cl. 307—297 9 Claims

Int. Cl. H03k *1/12;* H03f *3/04*

This invention relates to the biasing of electrical circuits utilizing semiconductor devices and in particular to means for stabilizing such circuits with temperature variations.

It is well known, that the operating point of electrical circuits such as direct current transistor amplifiers is very sensitive to changes in temperature. Temperature compensating bias networks in overcoming this problem essentially provide a fixed voltage for the desired operating point of the transistor stage and a varying voltage which compensates for the shift in the operating point of the mentioned stage with temperature.

Desirable properties of a compensating biasing network are therefore a compensating voltage portion which matches exactly the transistor stage or stages over a wide range of temperatures and, since small differences occur in the operating point and temperature behaviour of individual transistor stages, a fixed voltage portion which can be adjusted without substantially effecting the compensating portion. Only in this case will it be necessary to carry out once the relatively lengthy and costly procedure in determining temperature compensation, allowing the final operating point, which is often a function of the additional peripheral stages in electrical apparatus, to be adjusted afterwards.

To obtain compensating biasing circuits, use has been made of semiconductor devices which possess temperature dependent conductivity such as thermistors, semiconductive silicon resistors and junction diodes. In general these materials or components can be considered as consisting of a fixed and a temperature dependent voltage source, whereby the respective biasing voltages are developed by passing a current through the device. In some cases it may be sufficient to use directly the voltage developed across the terminals of such a compensating device, but in general the rate of change in voltages with temperature and the accompanying fixed voltage rarely fit the requirements and therefore a biasing network becomes necessary which usually incorporates one of the aforementioned temperature dependent devices in combination with resistors or other circuit components. In such networks however, it is difficult to achieve independence of the fixed and temperature dependent portion which often leads to costly repeated temperature compensation methods.

The present invention discloses a biasing arrangement which achieves the above objective and overcomes the above difficulties. Such arrangement comprises a first circuit including a number of semiconductor devices connected in series with a first resistor the number of semiconductor devices depending on the amount of compensation required. Such circuit is adapted to be connected to a source of D-C potential. A second circuit including a reference diode and a second resistor is connected in parallel with the first circuit, the polarity of the reference diode with respect to the polarity of the potential applied across the semiconductor devices being reversed. The reference diode is used to cancel out some of the fixed voltage appearing across the semiconductor devices and the first resistor in order to fit the proper biasing requirements. It is operated at a point of its characteristic near breakdown where its temperature dependent voltage goes from negative to positive and is practically negligible. Consequently the reference diode has no effect on the temperature dependent voltage of the semiconductor devices. The voltage appearing across the second resistor is applied between the base and emitter electrodes of the transistor to provide forward bias thereto.

The advantage of the above circuit is that the value of the temperature dependent voltage may be determined by varying the relative values of the first and second resistors. Once the temperature dependent voltage has been determined the fixed portion may be adjusted by varying the current flow through the first resistor. By varying the current flow through the first resistor, the voltage drop across it will change and consequently the voltage across the second resistor will vary. The voltage variation across the first resistor effected by varying the current therethrough does not effect the temperature dependent voltage.

The invention will now be described with reference to the accompanying drawings illustrating a preferred embodiment of the invention in which.

Figure 1:
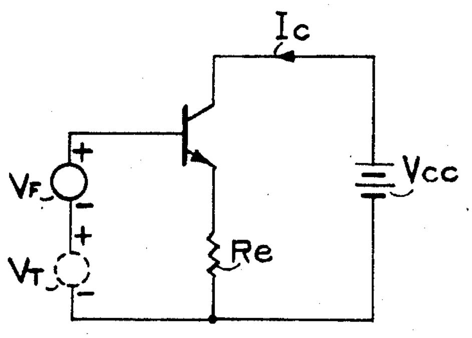
FIG. 1 illustrates a typical simplified transistor stage and its biasing requirements.

As an illustration of the requirements of a compensating biasing circuit it is desired to maintain $Ic$ in FIG. 1 constant with temperature. For a transistor with normal $\beta$ in this typical emitter follower configuration, the collector current with sufficient accuracy is given by:

$$Ic=\frac{V_F-V_{be}}{R_e}$$

where $V_F$ is the fixed biasing voltage and $V_{be}$ is the opposing base to emitter junction voltage which obeys the well-known junction equation and varies approximately −2 mv./C °. To maintain $Ic$ constant, another voltage source $V_T$ (shown dashed) opposing $V_{be}$ in series with $V_F$ can be added. The biasing voltage source then consists of a temperature dependent portion $V_T$ and a fixed portion $V_F$.

Figure 2:
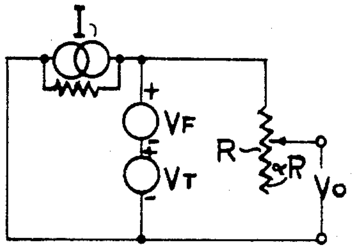
FIG. 2 illustrates a well known compensating circuit which does not provide independent control of the fixed and temperature dependent portions of the biasing circuit.

In FIG. 2 is shown an elementary biasing circuit consisting of a temperature dependent element symbolized by two voltage sources $V_F$ and $V_T$ where $V_F$ is fixed and $V_T$ is dependent on temperature. Fox example, such an element could be a series of junction diodes. If a chain of diodes is driven by a current source I, $V_F$ is relatively independent of I and can be considered as a voltage source. Similarly $V_T$ is relatively independent of I and only dependent on the ambient temperature. Within these approximations it is then easy to see that the output voltage $Vo$ consists of a fixed and a temperature dependent portion which are equally effected by the setting $\alpha$ of the voltage divider R:

$$Vo=\alpha(V_F+V_T)$$

The above illustrates the fact that variation of $\alpha$ equally effects $V_F$ and $V_T$ and that the operating point of a transistor circuit connected to such a biasing network cannot be varied without disturbing the temperature compensation and vice versa.

Figure 3:
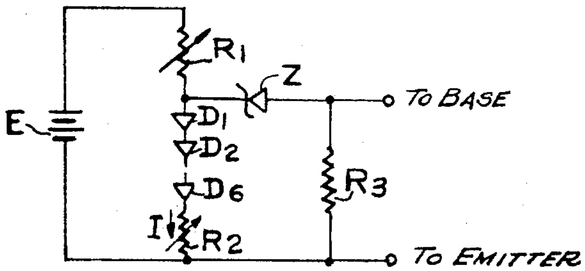
FIG. 3 illustrates a compensating circuit in accordance with the invention which provides independent control.

In FIG. 3 is shown a circuit which achieves the objective of the temperature dependent voltage being relatively independent of the adjusted bias conditions. A series of diodes D1–D6 preferably silicon diodes, although germanium diodes may also be used are connected in series with resistors R1 and R2 across a source of D-C potential E. Connected in parallel with diodes D1–D6 and resistor R2 is the series combination comprising reference diode Z and resistor R3. As shown, it is seen that diodes D1–D6 are biased in the forward direction with respect to battery E. In addition, reference diode Z is connected in opposition to diodes D1–D6 in order to cancel out some of the fixed voltage appearing across the diode series and the resistor R2 in order to provide the proper biasing potential.

The fixed voltage across resistor R3 is equal to the voltage across diodes D1–D6 minus the voltage across reference diode Z plus the voltage across resistor R2 as follows:

$$Vo=V_F-Vz+R2(I)$$

where $Vo$=the output voltage across R3

$V_F$=forward voltage across D1–D6

$Vz$=voltage across reference diode Z $I$=current through R2.

The temperature dependent voltage will be equal to:

$$\frac{R3}{R2+R3}V_T$$

where $V_T$=the temperature dependent voltage of diodes D1–D6. It is important to note here that reference diode Z is operated near its breakdown point at which point the temperature dependent voltage thereof goes from negative to positive. By operating the reference diode at such a point, its effect on the temperature dependent voltage of diodes D1–D6 can be considered as negligible.

The total voltage across resistor R3 is therefore equal to:

$$Vo=V_F-Vz+R2(I)+\left(\frac{R3}{R2+R3}\right)V_T$$

In considering the above equation it may be seen that by varying R2 to obtain the right temperature dependent voltage $Vo$ will change. However, this is not very critical since $Vo$ may be readjusted by varying the current I through a small change in R1 or E.

Compared to conventional temperature compensation circuits, the procedure for obtaining the right biasing circuit is relatively simple. R3 is chosen to operate reference diode Z near its breakdown point where its temperature dependent voltage is negligible. R2 is then determined to provide for proper temperature compensation. Finally the final fixed bias is adjusted by varying the resistance of R1 or the value of voltage source E. Resistance R1, which effectively is in parallel with R2 and R3 is made large enough so that it will not affect R2 and R3 when varied. Consequently the final fixed bias may be adjusted by varying R1 without affecting the temperature dependent voltage.

To more clearly illustrate the invention, assume that for biasing a transistor stage 800 mv. is required and a temperature dependent voltage of −8 mv./C°. Using a reference diode such as a 1N753A having a minimum temperature dependent voltage at 1.35 ma., resistance R3 will have to be approximately 600 ohms for a biasing potential of 800 mv. Since the drop across reference diode Z at 1.35 ma. is about 5.8 v., the voltage across the diodes D1–D6 and R2 must be 6.6 v. The fixed voltage across any one of diodes D1–D6 is approximately 600 mv. Consequently the total drop across D1–D6 will be 3600 mv. and the drop across resistance R2 will be 3000 mv.

The temperature dependent voltage of each diode D1–D6 as approximatively −2 mv./C°. Consequently, if a temperature voltage of −8 mv./C° is required, R2 can be found from:

$$-8=\frac{R3}{R2+R3}\times-12 \text{ mv./}C^{\circ}$$

$$R2\text{—}300 \text{ ohms}$$

The current through diodes D1–D6 and R2 will then be approximatively 10 ma. and the current through R1 11.35 ma. If the source of voltage E is set at 50 v., the resistance R1 will be approximatively 4000 ohms. The output of the bias circuit may be adjusted at 800 mv. by varying R1 without effecting the temperature dependent portion because R1, which effectively is in parallel with R2 and R3, is high enough not to affect the impedance of the parallel combination of R2 and R3.

For the purpose of illustrating the present invention the polarities of the voltage supply circuit have been shown as proper for a transistor of P type conductivity but it should be understood that biasing circuits suitable for opposite conductivity type transistors may be constructed by reversing the polarity of the battery E, diodes D1–D6 and reference diode Z in the circuit of FIG. 3 of the drawings.

It is also to be understood that the value of the components in the circuit disclosed are only representative and that they may be varied depending on the temperature compensation required as well as the value of the biasing potential required.

It is further to be understood that silicon or germanium diodes are not the only semiconductor devices suitable. For example, semiconductive silicon resistors could be used with advantage. Thermistors could also be used where the range of temperature compensation is limited. This is due to the fact that thermistors have a nonlinear coefficient of temperature compensation.

What is claimed is:

1. A biasing circuit for stabilizing the operation of a transistor having a base, an emitter and a collector electrode with variations in temperature effecting the base-emitter junction voltage thereof comprising:

a first circuit including a number of semiconductor devices connected in series with a first resistor, said circuit being adapted to be connected to a source of D-C voltage for biasing said semiconductor devices in the forward direction, the voltage across said semiconductor devices having a fixed portion, and a temperature dependent portion;

a second circuit including a reference diode and a second resistor connected in parallel with said first circuit, the polarity of said reference diode with respect to the polarity of the voltage applied across said semiconductor devices being reversed, and the voltage across said reference diode having a fixed portion and a negligible temperature dependent portion; and means for applying the voltage across the second resistor between the base and emitter electrodes of said transistor to apply forward bias thereto, the temperature dependent voltage provided by the semiconductor devices being determined by the relative value of the first and second transistor, the fixed voltage provided for the base and emitter electrodes being equal to the fixed voltage across the semiconductor devices minus the fixed voltage across the reference diode plus the voltage drop across the first resistor, said fixed voltage being adjustable by varying the current flow through the first resistor.

2. A biasing circuit as defined in claim 1 wherein the value of said second resistor is such that the current flowing through the reference diode is set to operate the reference diode at a point where its temperature dependent voltage is negligible whereby the temperature dependent voltage of the semiconductor devices is substantially not affected by the presence of the reference diode.

3. A biasing circuit as defined in claim 2 further including a third resistor in series with the semiconductor devices, said third resistor determining the value of the D-C current flowing through said first resistor to produce the desired fixed bias voltage.

4. A biasing circuit as defined in claim 3 wherein said third resistor has a resistance value higher than said first resistor in order not to effect the parallel combination of said first and second resistor when it is varied to adjust the fixed bias voltage.

5. A biasing circuit as defined in claim 1 wherein said semiconductor devices are diodes.

6. A biasing circuit as defined in claim 5 wherein said diodes are silicon diodes.

7. A biasing circuit as defined in claim 5 wherein said diodes are germanium diodes.

8. A biasing circuit as defined in claim 1 wherein said semiconductor devices are silicon resistors.

9. A biasing circuit as defined in claim 1 wherein said semiconductor devices are thermistors.

References Cited

UNITED STATES PATENTS

| | | | |
|---|---|---|---|
| 3,048,718 | 8/1962 | Starzec et al. | 307—310 X |
| 3,174,060 | 3/1965 | Schneider et al. | 307—310 |
| 3,281,656 | 10/1966 | Noble | 307—310 X |

OTHER REFERENCES

Bakke et al.: I.B.M. Technical Disclosure Bulletin, vol. 8, No. 9, February 1966, p. 1289.

ARTHUR GAUSS, *Primary Examiner.*

D. D. FORRER, *Assistant Examiner.*

U.S. Cl. X.R.

307—310; 330—23, 24